(12) United States Patent
Zhang et al.

(10) Patent No.: US 11,056,661 B2
(45) Date of Patent: Jul. 6, 2021

(54) COLOR CONVERSION LAYER, MANUFACTURING METHOD THEREOF, AND DISPLAY PANEL

(71) Applicant: WUHAN CHINA STAR OPTOELECTRONICS TECHNOLOGY CO., LTD., Wuhan (CN)

(72) Inventors: Guiyang Zhang, Wuhan (CN); Guowei Zha, Wuhan (CN)

( * ) Notice: Subject to any disclaimer, the term of this patent is extended or adjusted under 35 U.S.C. 154(b) by 83 days.

(21) Appl. No.: 16/475,136

(22) PCT Filed: Apr. 8, 2019

(86) PCT No.: PCT/CN2019/081713
§ 371 (c)(1),
(2) Date: Jul. 1, 2019

(87) PCT Pub. No.: WO2020/133787
PCT Pub. Date: Jul. 2, 2020

(65) Prior Publication Data
US 2020/0251675 A1 Aug. 6, 2020

(30) Foreign Application Priority Data
Dec. 29, 2018 (CN) .......................... 2018116330819.0

(51) Int. Cl.
*H01L 51/50* (2006.01)
*H01L 27/32* (2006.01)
*H01L 51/56* (2006.01)

(52) U.S. Cl.
CPC .......... *H01L 51/502* (2013.01); *H01L 27/322* (2013.01); *H01L 51/56* (2013.01); *H01L 2251/303* (2013.01)

(58) Field of Classification Search
CPC ..... H01L 51/502; H01L 27/322; H01L 51/56; H01L 2251/303
See application file for complete search history.

(56) References Cited

U.S. PATENT DOCUMENTS

| 2017/0299792 | A1   | 10/2017 | Oh et al. |
| 2018/0006093 | A1   | 1/2018  | Kim et al. |
| 2018/0022881 | A1\* | 1/2018  | Seki ....................... B32B 27/281 257/211 |
| 2018/0202616 | A1   | 7/2018  | Yoon et al. |
| 2019/0103521 | A1\* | 4/2019  | Umehara .............. G02F 1/1336 |

FOREIGN PATENT DOCUMENTS

| CN | 107077028 A | 8/2017 |
| CN | 107544174 A | 1/2018 |
| CN | 108573992 A | 9/2018 |
| JP | 2016218339 A | 12/2016 |

\* cited by examiner

*Primary Examiner* — Jose R Diaz (57) ABSTRACT

The present invention provides a color conversion layer, a manufacturing method of the color conversion layer, and a display panel. The color conversion layer is used in a display panel having a direct surface light source. The color conversion layer includes a quantum dot film and a functional film. The functional film is arranged at one side of the quantum dot film facing the direct surface light source. A light wave emitted by the direct surface light source is transmitted through the functional film into the quantum dot film. A light wave excited by the quantum dot film is reflected into the quantum dot film through the functional film.

17 Claims, 5 Drawing Sheets

COLOR CONVERSION LAYER, MANUFACTURING METHOD THEREOF, AND DISPLAY PANEL

FIELD OF DISCLOSURE

The present invention relates to a field of display panels and in particular, to a color conversion layer, a manufacturing method thereof, and a display panel.

DESCRIPTION OF RELATED ART

With the development of science and technology, people's living standards have improved remarkably, and new technology products have been updated more and more rapidly. With respect to display products alone, there have been from an earliest product—a cathode ray tube (CRT), then to a liquid crystal display (LCD), and to recent products such as an organic light emitting display (OLED), a quantum dot light emitting diode display (QLED), and a mini-LED display. Future micro-LED display technologies have also been proposed, and some domestic and foreign manufacturers are working on these technologies. A variety of head-mounted displays for augmented reality/virtual reality (AR/VR) have also been coming up to the market.

The current mainstream display technologies are LCD and OLED displays, but both of them have their own advantages and disadvantages. The LCD display is passive display. Although being inexpensive and highly reliable, it has been more and more difficult for the LCD displays to meet some of users' needs due to a low light energy use ratio, a low contrast, and a wide bezel. The OLED display is an active illuminating display, which has a high light energy use ratio, a thin shape, a narrow bezel, and a high screen ratio. Theoretically, the OLED display can provide an unlimited high contrast ratio, but its shortcomings are also obvious, such as a short lifespan, being sensitive to moisture, oxygen, and temperature, low luminance, and poor visibility in sunlight. In comparison, the LED displays have advantages of a small size, fast response, a wide viewing angle, high luminous efficiency, easily adjustable light-emitting bandwidths, and high reliability. As a result, the LED displays have been widely used in an ultra-thin display, a full-screen display, and a special-shaped display.

Figure 1:
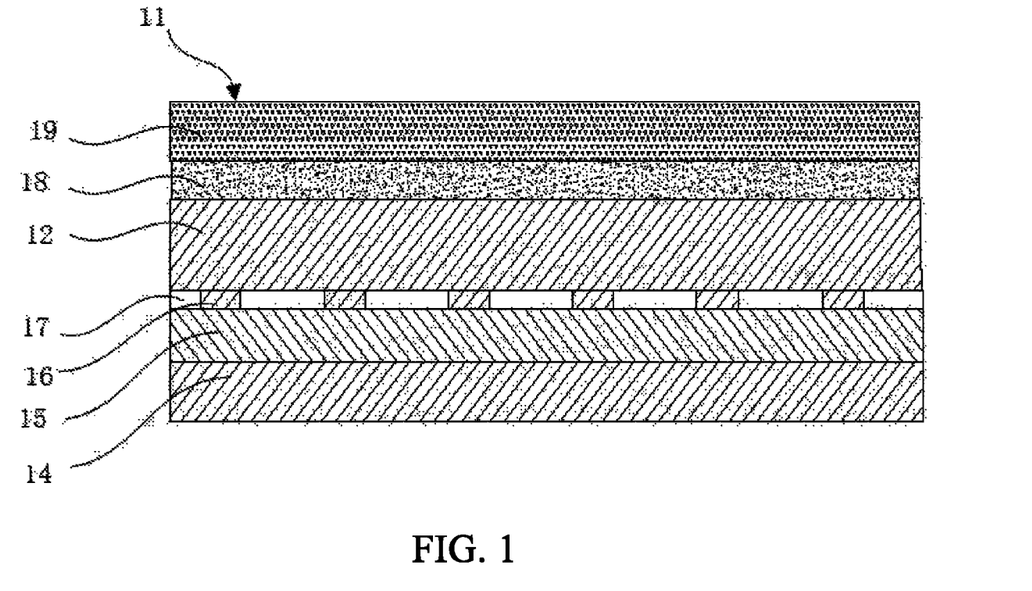
FIG. 1 is a schematic structural view illustrating a conventional display panel.

In order to achieve the three requirements of narrow bezel, high luminance, and reliability, a direct-lit LED display is provided. Certainly, a direct-lit QLED display is also feasible. Herein, taking an LED as an example, the LED includes a substrate 14, and a reflective layer 15, an LED 16, a planarization layer 17, a color conversion layer 12, a diffusion film 18, and a top coat film 19 which are sequentially disposed on the substrate 14. Refractive indexes between the layers/films are different, thus causing some of the emitted light to reflect back and forth inside the device. A reflectivity of the base reflective layer is less than 90%, so when light is reflected multiple times in the base reflective layer, backlight efficiency is greatly reduced, resulting in insufficient brightness of the display device or insufficient duration.

SUMMARY

The present invention provides a color conversion layer, a manufacturing method thereof, and a display panel, so as to solve the problem of loss of lighting efficiency caused by low reflectivity of the underlying substrate in the conventional panel with a direct surface light source.

The present invention provides a color conversion layer, used in a display panel having a direct surface light source, the color conversion layer comprising:

a quantum dot film; and a functional film disposed at one side of the quantum dot film facing the direct surface light source, a light wave emitted by the direct surface light source being transmitted through the functional film into the quantum dot film, a light wave excited by the quantum dot film being reflected into the quantum dot film through the functional film.

The color conversion layer further comprises a micro-structure layer disposed at one side of the quantum dot film away from the direct surface light source.

The color conversion layer further comprises a substrate, the substrate being disposed at one side of the functional film away from the quantum dot film.

The color conversion layer further comprises a first barrier layer and a substrate, the first barrier layer being disposed between the quantum dot film and the functional film, and the substrate being disposed between the first barrier layer and the functional film.

The color conversion layer further comprises a second barrier layer and a protective layer, the second barrier layer being disposed at one side of the quantum dot film away from the direct surface light source, and the protective layer being disposed at one side of the second barrier layer away from the quantum dot film.

The functional film further comprises a plurality of film layers stacked on each other, and each two adjacent film layers have different refractive indexes.

The functional film is made of a plurality of inorganic materials or organic materials; when the functional film is made of the inorganic materials, each of the film layers is made of any of $TiO_2$, $Al_2O_3$, $SiO_2$, ZnS, $ZrO_2$, $Ta_2O_5$, $Nb_2O_5$, and ITO; and when the functional film is made of the organic materials, each of the film layers is made of any of PC, PET, PMMA, and resin.

The present invention provides a display panel, comprising:

a direct surface light source; and a color conversion layer disposed on the direct surface light source, the color conversion layer comprising a quantum dot film and a functional film;

wherein the functional film is disposed at one side of the quantum dot film facing the direct surface light source, a light wave emitted by the direct surface light source is transmitted through the functional film into the quantum dot film, and a light wave excited by the quantum dot film is reflected into the quantum dot film through the functional film.

The color conversion layer further comprises a micro-structure layer and the micro structure layer is disposed at one side of the quantum dot film away from the direct surface light source.

The color conversion layer further comprises a substrate, and the substrate is disposed at one side of the functional film away from the quantum dot film.

The color conversion layer further comprises a first barrier layer and a substrate, the first barrier layer is disposed between the quantum dot film and the functional film, and the substrate is disposed between the first barrier layer and the functional film.

The color conversion layer further comprises a second barrier layer and a protective layer, the second barrier layer is disposed at one side of the quantum dot film away from the direct surface light source, and the protective layer is disposed at one side of the second barrier layer away from the quantum dot film.

The functional film further comprises a plurality of film layers stacked on each other, and each two adjacent film layers have different refractive indexes.

The present invention provides a manufacturing method of a color conversion layer, the color conversion layer being used in a display layer having a direct surface light source, the manufacturing method comprising:

providing a quantum dot film;

forming a functional film at one side of the quantum dot film facing the direct surface light source, wherein a light wave emitted by the direct surface light source is transmitted through the functional film into the quantum dot film, and a light wave excited by the quantum dot film is reflected into the quantum dot film through the functional film.

The manufacturing method of the color conversion layer further comprises: forming a micro-structure layer at one side of the quantum dot film away from the direct surface light source.

The manufacturing method of the color conversion layer further comprises: forming a substrate at one side of the functional film away from the quantum dot film.

The manufacturing method of the color conversion layer further comprises:

forming a first barrier layer between the quantum dot film and the functional film; and forming a substrate between the first barrier layer and the functional film.

The manufacturing method of the color conversion layer further comprises:

forming a second barrier layer at one side of the quantum dot film away from the direct surface light source; and forming a protective layer at one side of the second barrier layer away from the quantum dot film.

Forming the functional film at one side of the quantum dot film facing the direct surface light source further comprises forming a plurality of film layers made of a plurality of inorganic materials and stacked on each other at one side of the quantum dot film facing the direct surface light source by using a magnetron sputtering process or a vacuum evaporation process to constitute the functional film.

Forming the functional film at one side of the quantum dot film facing the direct surface light source further comprises forming a plurality of film layers made of a plurality of organic materials and stacked on each other at one side of the quantum dot film facing the direct surface light source by using a hot pressing, stretching, or roll-to-roll process to constitute the functional film.

The present invention has advantages as follows. In the display panel having the direct surface light source, a functional film is disposed at one side of the quantum dot film facing the direct surface light source, so that the light wave emitted by the direct surface light source is transmitted through the functional film into the quantum dot film, and a light wave excited by the quantum dot film is reflected into the quantum dot film through the functional film. Therefore, the light wave excited by the quantum dot film is prevented from reaching a base reflective layer of the display panel, thus reducing loss/absorption caused by the base reflective layer and improving lighting efficiency of the direct surface light source.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, front/rear, right/left, inside/outside, and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 2:
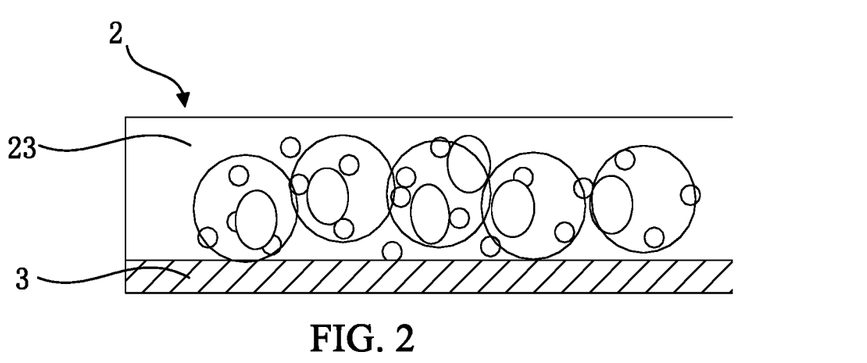
FIG. 2 is a first structural view illustrating a color conversion layer according to one embodiment of the present invention.

Please refer to FIG. 2, which is a schematic structural view illustrating a color conversion layer according to one embodiment of the present invention.

According to one embodiment of the present invention, the color conversion layer is used in a display panel having a direct surface light source. The color conversion layer 2 comprises a quantum dot film 23 and a functional film 3. The quantum dot film 23 includes a plurality of luminescent quantum dots and a light scattering agent. The light scattering agent has two functions: increasing a propagation path length of the excited light and controlling a spacing between the luminescent quantum dots. The quantum dot film has a thickness of about 50 to 100 μm.

Figure 3:
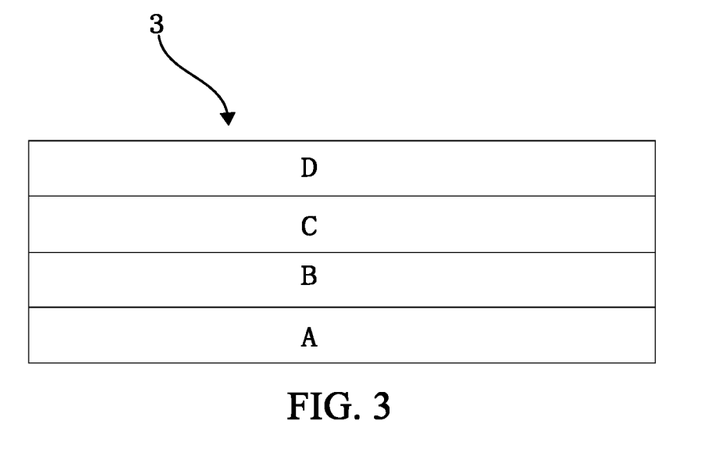
FIG. 3 is schematic structural view illustrating a functional film of the color conversion layer according to one embodiment of the present invention.

The functional film 3 includes a plurality of film layers stacked one on another, a refractive index of each film layer may be the same or different, and a thickness of each film layer may be the same or different, but the refractive indexes of each two adjacent film layers are different. For example, as shown in FIG. 3, the functional film 3 comprises a film layer A, a film layer B, a film layer C, and a film layer D. The film layers A and B have different refractive indexes, the film layers B and C have different refractive indexes, and the film layers C and D have different refractive indexes.

In addition, the functional film can be made of a plurality of inorganic materials or organic materials. When the functional film is made of the inorganic materials, each film layer is made of, but not limited to, titanium dioxide (TiO2), aluminum oxide (Al2O3), silicon dioxide (SiO2), zinc sulfide (ZnS), zirconium dioxide (ZrO2), tantalum pentoxide (Ta2O5), niobium oxide (Nb2O5), or indium tin oxide (ITO). When the functional film is made of the organic materials, each film layer is made of, but not limited to, polycarbonate (PC), polyethylene terephthalate (i.e., polyester or PET), polymethyl methacrylate (i.e., PMMA or Acrylic), or resin.

Referring to FIG. 2, the functional film 3 is disposed at one side of the quantum dot film 23 facing the direct surface light source (not illustrated). In other words, the functional film 3 is disposed between the quantum dot film 23 and the direct surface light source. A light wave emitted by the direct surface light source is transmitted through the functional film 3 into the quantum dot film 23, and a light wave excited by the quantum dot film 23 is reflected into the quantum dot film 23 through the functional film 3. Therefore, the light wave excited by the quantum dot film 23 can only be emitted from an upper surface of the color conversion layer, and cannot reach a base reflective layer of the display panel, thereby reducing loss/absorption caused by the base reflective layer and improving lighting efficiency of the direct surface light source. In addition, the color conversion layer 2 in this embodiment includes only the quantum dot film 23 and the functional film 3, so that the color conversion layer 2 is thin and has good stability.

Figure 4:
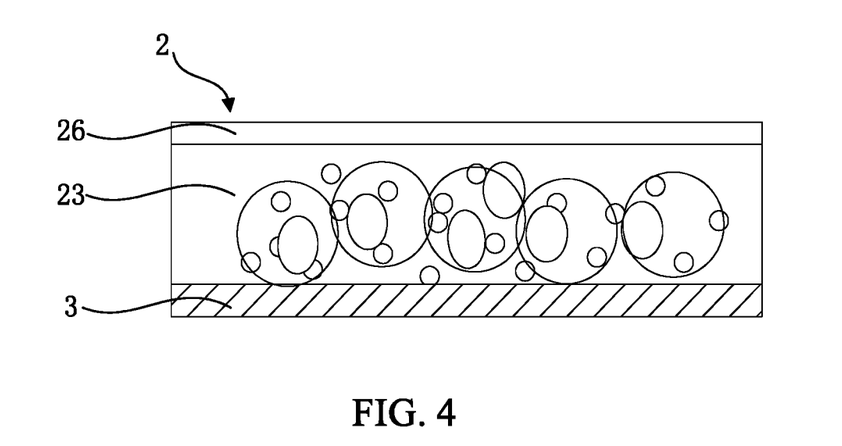
FIG. 4 is a second structural view illustrating the color conversion layer according to one embodiment of the present invention.

Referring to FIG. 4, according to one embodiment of the present invention, the color conversion layer 2 further comprises a micro-structure layer 26. That is to say, the color conversion layer 2 comprises the quantum dot film 23, the functional film 3, and the micro-structure layer 26. The micro-structure layer 26 is disposed at one side of the quantum dot film 23 away from the direct surface light source. In the present embodiment, the micro-structure layer 26 is provided on a light-emitting side of the color conversion layer 2 to homogenize light and eliminate a phenomenon of Newton's rings.

Figure 5:
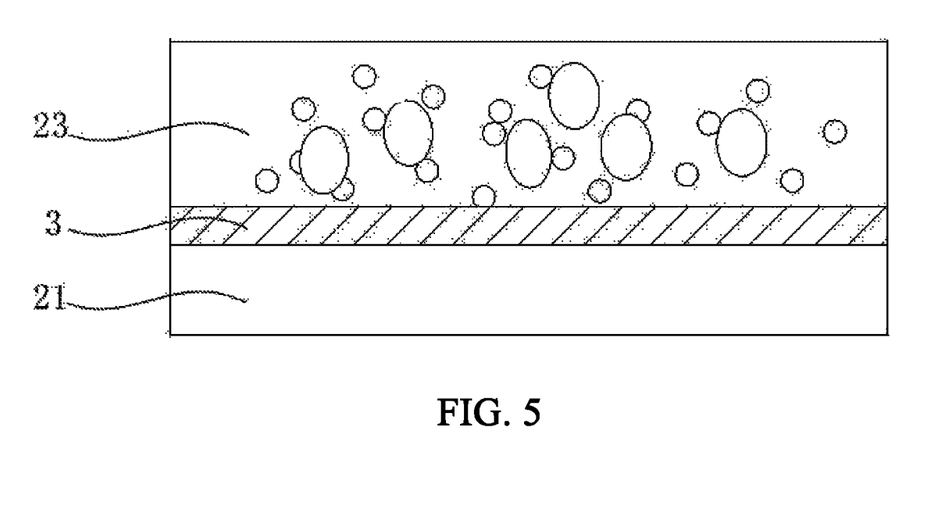
FIG. 5 is a third structural view illustrating the color conversion layer according to one embodiment of the present invention.

Referring to FIG. 5, according to another embodiment of the present invention, the color conversion layer 2 further comprises a substrate 21. In other words, the color conversion layer comprises the quantum dot film 23, the functional film 3, and the substrate 21. The substrate 21 is disposed at one side of the functional film 3 away from the quantum dot film 23. The substrate 21 is made of polyethylene terephthalate (PET). According to the present embodiment, the functional film is disposed between the quantum dot film and the substrate to serve as both a moisture/oxygen barrier and a functional film.

Figure 6:
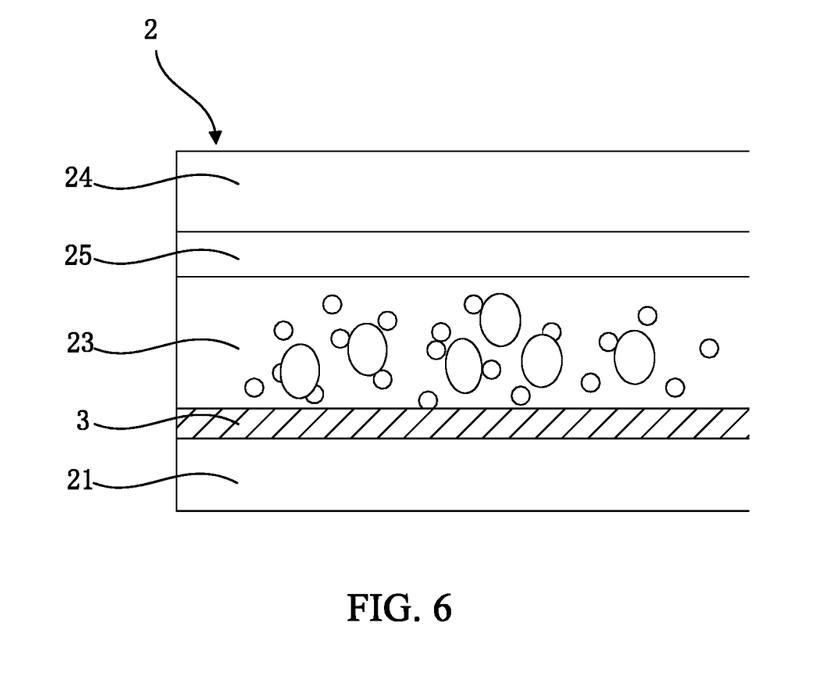
FIG. 6 is a fourth structural view illustrating the color conversion layer according to one embodiment of the present invention.

In still another embodiment of the present invention, a second barrier layer or a protective layer may be disposed on the quantum dot film. Alternatively, a second barrier layer and a protective layer may both be disposed on the quantum dot film at the same time. In addition to having the substrate, the color conversion layer may also comprise the second barrier layer and/or the protective layer. As shown in FIG. 6, the color conversion layer 2 comprises the quantum dot film 23, the functional film 3, the substrate 21, the second barrier layer 25, and the protective layer 24. The substrate 21 is disposed at one side of the functional film 3 away from the quantum dot film 23. The second barrier layer 25 is disposed at one side of the quantum dot film 23 away from the direct surface light source, and the protective layer 24 is disposed at one side of the second barrier layer 25 away from the quantum dot film 23. The protective layer 24 is made of PET, and a thickness of the second barrier layer is several ten micrometers for isolating moisture and oxygen, thus avoiding a decrease in luminous efficiency resulting from water and oxygen contacting the quantum dots.

Figure 7:
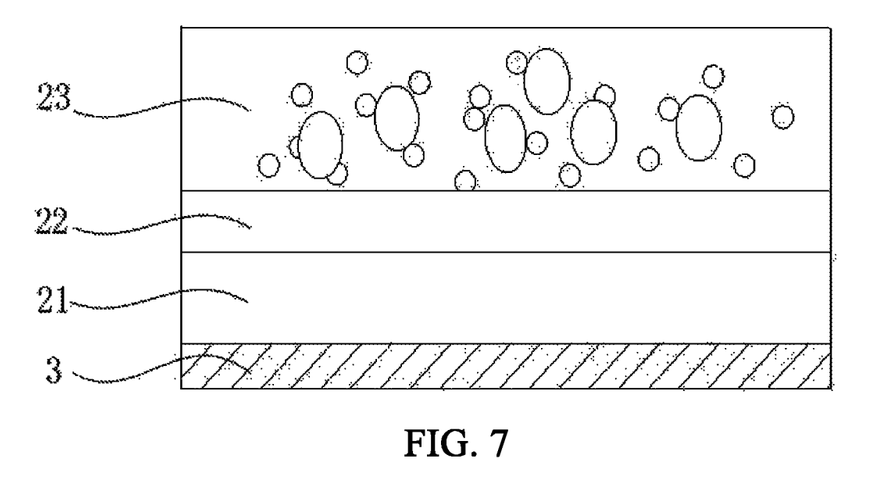
FIG. 7 is a fifth structural view illustrating the color conversion layer according to one embodiment of the present invention.

According to still another embodiment of the present invention, a first barrier layer or a substrate is disposed between the quantum dot film and the functional film. Alternatively, the first barrier layer and the substrate are both disposed between the quantum dot film and the functional film at the same time. Referring to FIG. 7, the color conversion layer 2 comprises the quantum dot film 23, the functional film 3, the first barrier layer 22, and the substrate 21, wherein the first barrier layer 22 is disposed between the quantum dot film 23 and the functional film 3, and the substrate 21 is disposed between the first barrier layer 22 and the functional film 3.

Figure 8:
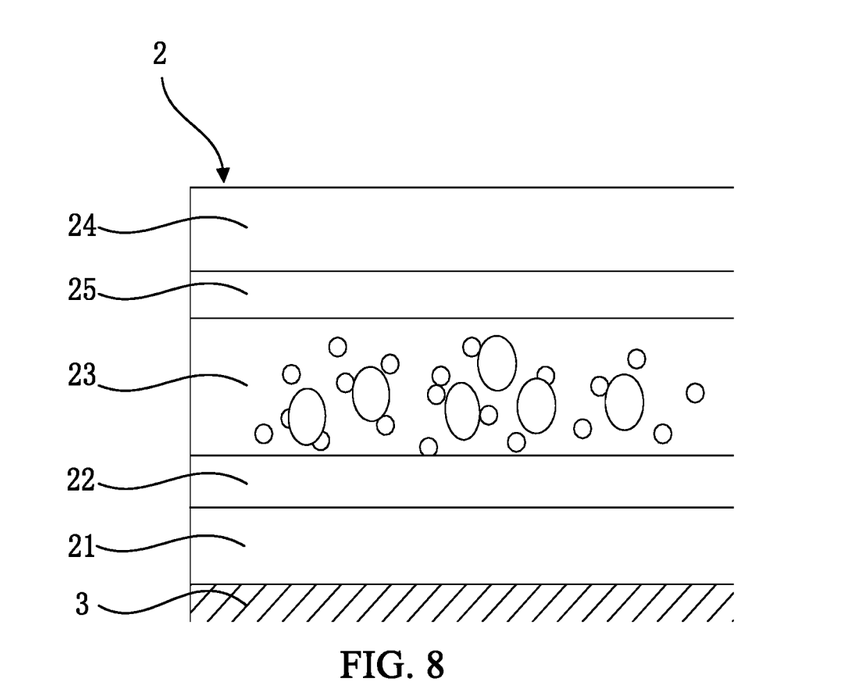
FIG. 8 is a sixth structural view illustrating the color conversion layer according to one embodiment of the present invention.

In yet another embodiment of the present invention, besides having the first barrier layer or/and the substrate, the color conversion layer is also provided with the second barrier layer or the protective layer on the quantum dot film; alternatively, the color conversion layer comprises both the second barrier layer and the protective layer on the quantum dot film at the same time. As shown in FIG. 8, the color conversion layer 2 comprises the quantum dot film 23, the functional film 3, the first barrier layer 22, the substrate 21, the second barrier layer 25, and the protective layer 24. The first barrier layer 22 is disposed between the quantum dot film 23 and the functional film 3. The substrate 21 is disposed between the first barrier layer 22 and the functional film 3. The second barrier layer 25 is disposed at one side of the quantum dot film 23 away from the direct surface light source, and the protective layer 24 is disposed at one side of the second barrier layer 25 away from the quantum dot film 23.

It should be noted that the color conversion layer provided in the embodiments of the present invention can be used in different illuminating films. For example, in the case of a mini-LED backlight source, the color conversion layer can collaborate with different light boards to be used in small, medium, large sized display devices.

It can be seen from the above that the color conversion layer in this embodiment has the functional film at one side of the quantum dot film facing the direct surface light source in the display panel having the direct surface light source, so that the light wave emitted by the direct surface light source is transmitted through the functional film into the quantum dot film, and the light wave excited by the quantum dot film is reflected into the quantum dot film through the functional film. Therefore, the light wave excited by the quantum dot film is prevented from reaching a base reflective layer of the display panel, thus reducing loss/absorption caused by the base reflective layer and improving lighting efficiency of the direct surface light source.

A display panel is provided according to one embodiment of the present invention. The display panel comprises a direct surface light source and a color conversion layer disposed on the direct surface light source. The color conversion layer is the color conversion layer in the above embodiment, and a detailed description thereof is not repeated herein for brevity.

Figure 9:
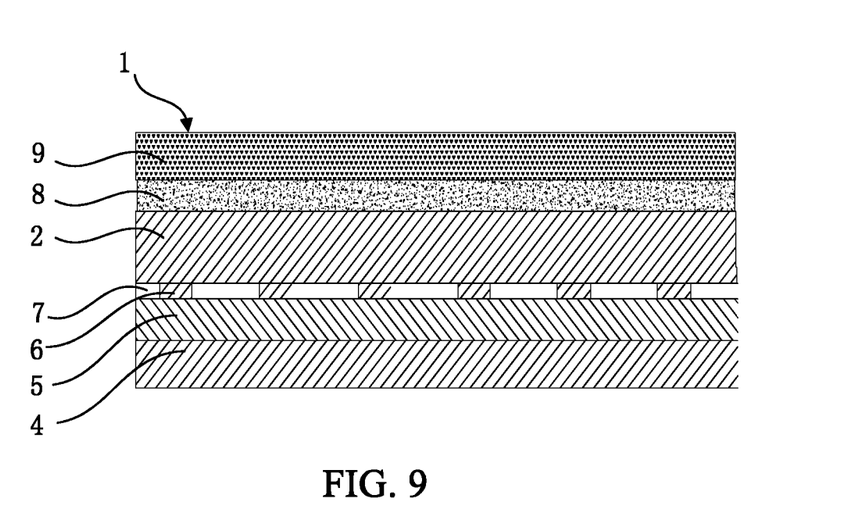
FIG. 9 is schematic structural view illustrating a display panel according to one embodiment of the present invention.

When the display panel is a light emitting diode (LED) panel, the direct surface light source is an LED chip. The display panel further comprises a substrate, a reflective layer, a planarization layer, a diffusion film, and a top coat film. Referring to FIG. 9, the display panel 1 comprises the substrate 4, the reflective layer 5, the LED chip 6, the planarization layer 7, the color conversion layer 2 of the above-mentioned embodiment, the diffusion film 8, and the top coat film 9.

According to the present embodiment, a light wave emitted by the direct surface light source is transmitted through the functional film into the quantum dot film, and a light wave excited by the quantum dot film is reflected into the quantum dot film through the functional film. Therefore, the light wave excited by the quantum dot film is prevented from reaching a base reflective layer of the display panel, thereby reducing loss/absorption caused by the base reflective layer and improving lighting efficiency of the direct surface light source.

Figure 10:
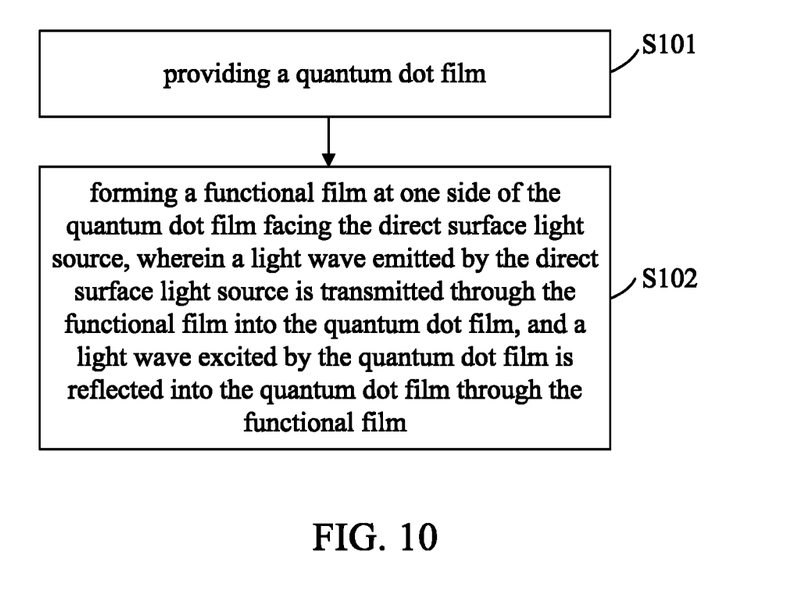
FIG. 10 is a process flow diagram illustrating a manufacturing method of the color conversion layer according to one embodiment of the present invention.

Moreover, the present invention provides a manufacturing method of a color conversion layer, the color conversion layer being used in a display layer having a direct surface light source. Referring to FIG. 10, the manufacturing method comprises steps as follows:

Step 101: providing a quantum dot film.

In the present embodiment, the quantum dot film comprises a plurality of luminescent quantum dots and a light scattering agent. The light scattering agent has two functions: increasing a propagation path length of the excited light and controlling a spacing between the luminescent quantum dots. The quantum dot film has a thickness of about 50 to 100 μm.

In one embodiment, manufacturing the quantum dot film comprises: mixing uniformly a quantum dot material and a light scattering agent, encapsulating a mixture thereof with a high molecular polymer, and making a quantum dot film of a certain specification (for example, a certain thickness) by an extrusion technique. The quantum dot film produced by this way is thinner and has better stability.

Step 102: forming a functional film at one side of the quantum dot film facing the direct surface light source, wherein a light wave emitted by the direct surface light source is transmitted through the functional film into the quantum dot film, and a light wave excited by the quantum dot film is reflected into the quantum dot film through the functional film.

For example, in step 102, forming the functional film at one side of the quantum dot film facing the direct surface light source comprises: forming a plurality of film layers made of a plurality of inorganic materials and stacked on each other at one side of the quantum dot film facing the direct surface light source by using a magnetron sputtering process or a vacuum evaporation process to constitute the functional film.

It should be noted that, the functional film comprises a plurality of film layers. The film layers can be produced by inorganic material coating. In other words, the functional film produced is made of a plurality of inorganic materials. The film layers can have the same or different refractive indexes, and the film layers can have the same or different thicknesses, but each two adjacent film layers have different refractive indexes. Each film layer is made of, but not limited to, titanium dioxide (TiO2), aluminum oxide (Al2O3), silicon dioxide (SiO2), zinc sulfide (ZnS), zirconium dioxide (ZrO2), tantalum pentoxide (Ta2O5), niobium oxide (Nb2O5), or indium tin oxide (ITO).

In one example, in step 102, forming the functional film at one side of the quantum dot film facing the direct surface light source further comprises: forming a plurality of film layers, made of a plurality of organic materials and stacked on each other, at one side of the quantum dot film facing the direct surface light source by using a hot pressing, stretching, or roll-to-roll process to constitute the functional film.

It should be noted that, each film layer of the functional film is produced by hot pressing an organic material. That is, the functional film is made of a plurality of organic materials, each film layer is made of, but not limited to, polycarbonate (PC), polyethylene terephthalate (i.e., polyester or PET), polymethyl methacrylate (i.e., PMMA or Acrylic), or resin.

Referring to FIG. 2, the functional film 3 is formed at one side of the quantum dot film 23 facing the direct surface light source (not illustrated). The functional film 3 is formed between the quantum dot film 23 and the direct surface light source. A light wave emitted by the direct surface light source is transmitted through the functional film 3 into the quantum dot film 23, and a light wave excited by the quantum dot film 23 is reflected into the quantum dot film 23 through the functional film 3. Therefore, the light wave excited by the quantum dot film 23 can only be emitted from an upper surface of the color conversion layer, and cannot reach a base reflective layer of the display panel, thus reducing loss/absorption caused by the base reflective layer and improving lighting efficiency of the direct surface light source.

According to one embodiment of the present invention, the manufacturing method of the color conversion layer further comprises: forming a micro-structure layer at one side of the quantum dot film away from the direct surface light source.

Referring to FIG. 4, a micro-structure layer 26 is provided at one side of the quantum dot film 23 away from the direct surface light source. The micro-structure layer 26 is provided to homogenize light and eliminate a phenomenon of Newton's rings.

According to another embodiment of the present invention, the manufacturing method of the color conversion layer further comprises forming a substrate at one side of the functional film away from the quantum dot film.

Referring to FIG. 5, a substrate 21 is formed at one side of the functional film 3 away from the quantum dot film 23. The substrate 21 is made of PET. In the present embodiment, the functional film is disposed between the quantum dot film and the substrate to serve as both a moisture/oxygen barrier and a functional film.

According to still another embodiment of the present invention, the manufacturing method of the color conversion layer further comprises: forming a first barrier layer between the quantum dot film and the functional film; and forming a substrate between the first barrier layer and the functional film.

Referring to FIG. 7, a first barrier layer 22 is provided between the quantum dot film 23 and the functional film 3. The substrate 21 is formed between the first barrier layer 22 and the functional film 3. Therefore, the color conversion layer 2 comprises the quantum dot film 23, the functional film 3, the first barrier layer 22, and the substrate 21. In addition, it is also feasible that only the first barrier layer or the substrate is formed between the quantum dot film and the functional film.

According to yet another embodiment of the present invention, the manufacturing method of the color conversion layer further comprises: forming a second barrier layer at one side of the quantum dot film away from the direct surface light source; and forming a protective layer at one side of the second barrier layer away from the quantum dot film.

Please be noted that, it is also feasible that, only the second barrier layer or the protective layer is formed between the quantum dot film and the functional film at one side of the quantum dot film away from the direct surface light source. Alternatively, in addition to having the substrate, the color conversion layer can also comprise the second barrier layer and/or the protective layer at one side of the quantum dot film away from the direct surface light source. As shown in FIG. 6, the substrate 21 is formed at one side of the functional film 3 away from the quantum dot film 23. The second barrier layer 25 is formed at one side of the quantum dot film 23 away from the direct surface light source. The protective layer 24 is disposed at one side of the second barrier layer 25 away from the quantum dot film 23. The color conversion layer 2 comprises the quantum dot film 23, the functional film 3, the substrate 21, the second barrier layer 25, and the protective layer 24. The protective layer 24 is made of PET, a thickness of the second barrier layer is several ten micrometers for isolating moisture and oxygen, thus avoiding a decrease in luminous efficiency resulting from water and oxygen contacting the quantum dots.

As can be seen from the above, in the method for fabricating the OLED display panel of the present embodiment, an opening is defined in at least one sub-pixel region of the camera lens region of the OLED panel, the pixel density of the camera lens region is reduced, the light transmittance of the camera lens region is improved, and furthermore, the camera assembly on the bottom surface of the OLED panel is disposed at a position corresponding to the opening. Therefore, the camera assembly in the non-display area occupies a less space, and a screen ratio is increased.

In summary, the present invention provides the manufacturing method of the color conversion layer. In the display panel having the direct surface light source. The functional film is formed at one side of the quantum dot film facing the direct surface light source. The light wave emitted by the direct surface light source is transmitted through the functional film into the quantum dot film, and the light wave excited by the quantum dot film is reflected into the quantum dot film through the functional film. Therefore, the light wave excited by the quantum dot film is prevented from reaching the base reflective layer of the display panel, thereby reducing loss/absorption caused by the base reflective layer and improving lighting efficiency of the direct surface light source.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A color conversion layer, disposed in a display panel having a direct surface light source, the color conversion layer comprising:
  a quantum dot film;
  a functional film disposed between the quantum dot film and the direct surface light source, a light wave emitted by the direct surface light source being transmitted through the functional film into the quantum dot film, a light wave excited by the quantum dot film being reflected into the quantum dot film through the functional film;
  a substrate disposed between the quantum dot film and the functional film;
  a first barrier layer disposed between the substrate and the quantum dot film;
  a second barrier layer disposed at one side of the quantum dot film away from the first barrier layer; and
  a protective layer disposed at one side of the second barrier layer away from the quantum dot film.

2. The color conversion layer according to claim 1, further comprising a micro-structure layer disposed at one side of the quantum dot film away from the direct surface light source.

3. The color conversion layer according to claim 1, further comprising a substrate, the substrate being disposed at one side of the functional film away from the quantum dot film.

4. The color conversion layer according to claim 1, further comprising a second barrier layer and a protective layer, the second barrier layer being disposed at one side of the quantum dot film away from the direct surface light source, and the protective layer being disposed at one side of the second barrier layer away from the quantum dot film.

5. The color conversion layer according to claim 1, wherein the functional film further comprises a plurality of film layers stacked on each other, and each two adjacent film layers have different refractive indexes.

6. The color conversion layer according to claim 5, wherein the functional film is made of a plurality of inorganic materials or organic materials; when the functional film is made of the inorganic materials, each of the film layers is made of any of $TiO_2$, $Al_2O_3$, $SiO_2$, $ZnS$, $ZrO_2$, $Ta_2O_5$, $Nb_2O_5$, and ITO; and when the functional film is made of the organic materials, each of the film layers is made of any of PC, PET, PMMA, and resin.

7. A display panel, comprising:
  a direct surface light source;
  a color conversion layer disposed on the direct surface light source, the color conversion layer comprising a quantum dot film and a functional film;
  wherein the functional film is disposed between the quantum dot film and the direct surface light source, a light wave emitted by the direct surface light source is transmitted through the functional film into the quantum dot film, and a light wave excited by the quantum dot film is reflected into the quantum dot film through the functional film;
  a substrate disposed between the quantum dot film and the functional film;
  a first barrier layer disposed between the substrate and the quantum dot film;
  a second barrier layer disposed at one side of the quantum dot film away from the first barrier layer; and
  a protective layer disposed at one side of the second barrier layer away from the quantum dot film.

8. The display panel according to claim 7, wherein the color conversion layer further comprises a micro-structure layer ' and the micro structure layer is disposed at one side of the quantum dot film away from the direct surface light source.

9. The display panel according to claim 7, wherein the color conversion layer further comprises a substrate, and the substrate is disposed at one side of the functional film away from the quantum dot film.

10. The display panel according to claim 7, wherein the color conversion layer further comprises a second barrier layer and a protective layer, the second barrier layer is disposed at one side of the quantum dot film away from the direct surface light source, and the protective layer is disposed at one side of the second barrier layer away from the quantum dot film.

11. The display panel according to claim 7, wherein the functional film further comprises a plurality of film layers stacked on each other, and each two adjacent film layers have different refractive indexes.

12. A manufacturing method of a color conversion layer, the color conversion layer disposed in a display layer having a direct surface light source, the manufacturing method comprising:

providing a quantum dot film;

forming a functional film between the quantum dot film and the direct surface light source, wherein a light wave emitted by the direct surface light source is transmitted through the functional film into the quantum dot film, and a light wave excited by the quantum dot film is reflected into the quantum dot film through the functional film;

providing a substrate between the quantum dot film and the functional film;

providing a first barrier layer between the substrate and the quantum dot film;

providing a second barrier layer at one side of the quantum dot film away from the first barrier layer; and forming a protective layer at one side of the second barrier layer away from the quantum dot film.

13. The manufacturing method of the color conversion layer according to claim 12, further comprising:

forming a micro-structure layer at one side of the quantum dot film away from the direct surface light source.

14. The manufacturing method of the color conversion layer according to claim 12, further comprising:

forming a substrate at one side of the functional film away from the quantum dot film.

15. The manufacturing method of the color conversion layer according to claim 12, further comprising:

forming a second barrier layer at one side of the quantum dot film away from the direct surface light source; and forming a protective layer at one side of the second barrier layer away from the quantum dot film.

16. The manufacturing method of the color conversion layer according to claim 12, wherein forming the functional film at one side of the quantum dot film facing the direct surface light source further comprises forming a plurality of film layers made of a plurality of inorganic materials and stacked on each other at one side of the quantum dot film facing the direct surface light source by using a magnetron sputtering process or a vacuum evaporation process to constitute the functional film.

17. The manufacturing method of the color conversion layer according to claim 12, wherein forming the functional film at one side of the quantum dot film facing the direct surface light source further comprises forming a plurality of film layers made of a plurality of organic materials and stacked on each other at one side of the quantum dot film facing the direct surface light source by using a hot pressing, stretching, or roll-to-roll process to constitute the functional film.

* * * * *